Nov. 17, 1970 P. ABRAMSON 3,541,348

"UP TO M OUT OF N" LOGIC CIRCUIT

Filed Sept. 11, 1968

INVENTOR
PAUL ABRAMSON
BY John J. Goodwin
ATTORNEY

United States Patent Office

3,541,348

Patented Nov. 17, 1970

3,541,348

"UP TO M OUT OF N" LOGIC CIRCUIT

Paul Abramson, Yorktown Heights, N.Y., assignor to International Business Machines Corporation, Armonk, N.Y., a corporation of New York Filed Sept. 11, 1968, Ser. No. 758,935
Int. Cl. H03k *19/42*
U.S. Cl. 307—211 11 Claims

ABSTRACT OF THE DISCLOSURE

A circuit is described which provides an output signal upon the presence of one and only one of N possible input signals. The circuit includes two or more input terminals, each connected through a separate input resistor to one side of a Zener diode and to one side of a common load resistor. The other side of the common load resistor is connected to the collector electrode of a transistor and the base electrode of the transistor is connected to the other side of the Zener diode. The circuit operates such that an output signal is produced on an output lead connected to the collector electrode when an input signal is supplied to one and only one of the input terminals. No output is present on the output lead when there are no input signals on the input terminals or when input signals are present on more than one input terminal. The circuit can also be designed to provide an indication of up to M of N input signals where M can be greater than one and less than N.

FIELD OF THE INVENTION

The present invention is in the logic circuit art and, more particularly, relates to switching circuit utilizing input signals imposed through a Zener diode and transistor arrangement to provide a circuit control function.

DESCRIPTION OF THE PRIOR ART

Prior art systems are known which employ a plurality of input terminals in combination with a Zener diode and a transistor and which provide for an "AND" function, an "OR" function or an "AT LEAST" function. An example of a prior art system is provided in U.S. Pat. 3,341,713, issued Sept. 12, 1967, to F. B. Shaffer et al. This patent illustrates an AND circuit which provides an output signal upon the presence of input signals on all the input terminals, an OR circuit which provides an output signal upon the presence of an input signal on one or more of the input terminals, and an AT LEAST circuit which produces a output signal when there is an input signal present at less than all of the circuit input terminals, provided there is at least a predetermined plurality of input signals. This patent is distinct from the present invention in that there is no teaching of a circuit to produce an output signal on the occurrence of one and only one input signal.

SUMMARY OF THE INVENTION

It is an object of the present invention to provide a circuit which produces an output signal on the occurrence of an input signal at one and only one of a plurality of input terminals. An advantage of the circuit of the present invention is that it employs one transistor and one Zener diode. The circuit requires very little power in the input signal and requires no power supply and a portion of the input signal is used to provide an output signal.

The foregoing and other objects, features and advantages of the invention will be apparent from the following more particular description of the preferred embodiments of the invention, as illustrated in the accompanying drawing.

DESCRIPTION OF THE PREFERRED EMBODIMENTS

Figure 1:
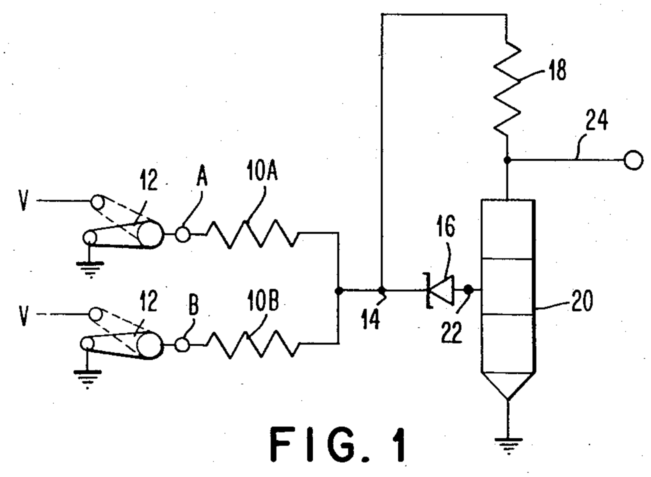
FIG. 1 is a schematic diagram of a circuit embodiment of the present invention which employs two input terminals and can be used as an "Exclusive OR" circuit.

The present invention is a circuit having two or more input terminals. Each input terminal which is normally at ground potential is connected through a separate input resistor to one side of a threshold device, such as a Zener diode, and also through a common load resistor to a switching means, for example, to the collector electrode of a transistor. The base electrode of the transistor is connected to the other side of the Zener diode. The circuit of FIG. 1 may be employed as an exclusive OR circuit, that is, a circuit which produces an output signal upon the presence of an input signal on one and only one of two input terminals. In FIG. 1, the input terminals designated A and B are connected to one side of equal valued resistors 10A and 10B respectively. The other sides of resistors 10A and 10B are connected to a common point 14 on one side of a Zener diode 16. The other sides of the resistors 10A and 10B are also connected to a load resistance 18 which is connected to the collector electrode of NPN transistor 20. The base electrode of transistor 20 is connected to the other side of the Zener diode 16 at point 22. The Zener diode 16 contains a PN junction having a determinable breakover voltage value so that the Zener diode serves to block current flow and becomes conductive only when a predetermined reversed biased potential is imposed across the PN junction. When the potential across the Zener diode exceeds a pre-selected value, the Zener diode breaks over or becomes highly conductive. Thus, when the voltage at junction 14 reaches or exceeds a predetermined voltage value relative to point 22, the diode 16 becomes highly conductive and conducts a signal to the base electrode of normally non-conducting transistor 20 and causes transistor 20 to conduct. When the voltage value at junction 14 falls below the pre-selected value, the Zener diode 16 ceases to be conductive and transistor 20 returns to the non-conducting condition.

When an input voltage is applied to either one of the terminals A or B, the terminal is raised above ground potential and a voltage drop is produced across resistors 10A and 10B. Thus, if a voltage V is applied at terminal A, point 14 will have a potential ½ V. However, if a voltage V is applied to both terminals A and B, the potential at point 14 will be equal to V. The Zener diode 16 breakover voltage is selected to be slightly below V but above ½ V.

If either one of terminals A or B is raised to a potential V, a voltage ½ V will appear at junction 14 and Zener diode 16 will remain non-conductive and transistor 20 will also not conduct and an output signal will appear on output lead 24. If both terminals A and B are raised to a potential V, the voltage at junction 14 will be V and the Zener diode 16 will break over and conduct signal to the base of transistor 20 thereby turning on transistor 20. Transistor 20 becomes a short circuit to ground and no output signal appears on output lead 24. Thus, an output signal appears on lead 24 when there is an input signal condition on either input terminal A or B but there is no output signal present on lead 24 in the absence of any input signal and when there is an input signal condition on both leads A and B. Thus, FIG. 1 provides a circuit which can be employed as a logical exclusive OR circuit.

Figure 2:
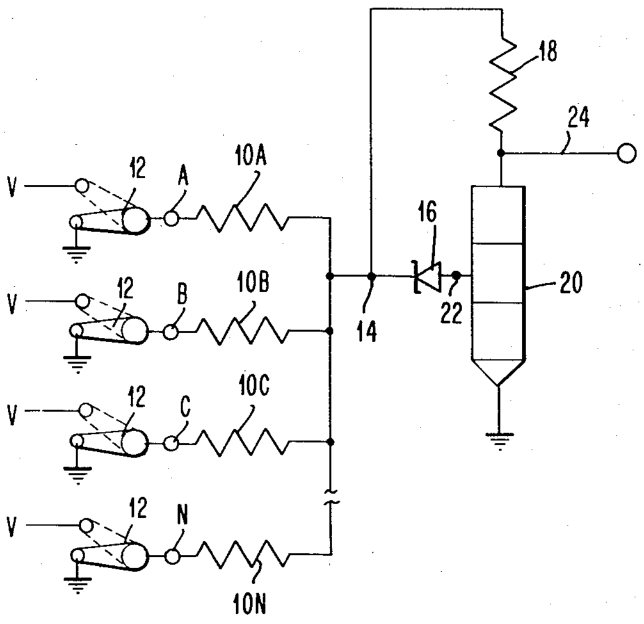
FIG. 2 is a schematic circuit embodiment of a circuit having a plurality of input terminals greater than two and may be used as a "one out of N" circuit.

Referring to FIG. 2, an embodiment of the present invention having more than two input terminals is shown. The circuit of FIG. 2 functions as a "one out of N" circuit. The circuit of FIG. 2 is similar to that of FIG. 1 but with one exception. Additional input terminals C . . . N are provided, each connected through separate resistors 10C . . . 10N to point 14. Resistors 10C . . . 10N have have values equal to the value of resistors 10A and 10B. When one of the input terminals is raised to a potential V, a voltage divider network is formed consisting of the resistor associated with the terminal in series circuit with the resistors of the other terminals in parallel circuit. For example, if N is equal to four, and terminal A is raised to voltage V and resistors 10A, 10B, 10C and 10N have resistance value R, then resistance 10A will be connected in series circuit at point 14 with the resistors 10B, 10C and 10N in parallel circuit. Resistances 10B, 10C and 10N in parallel circuit produce a total resistance of ⅓ R. The potential at point 14 when only one terminal is raised to V will therefore be ¼ V.

If two terminals are raised to V, the resistors associated with the terminal will be in parallel and will be connected in series with the other two resistors in parallel and the potential at point 14 will be ½ V. When three of the four input terminals are raised to potential V, point 14 will have a potential ¾ V and when all four terminals are raised to potential V, point 14 will have a potential V. Thus, for the case of N equal to four, the Zener diode is selected to have a breakover voltage value below ½ V but above ¼ V. If it is desired to have the circuit operate such that an indication of "one or two out of four" is provided, the Zener diode may be selected to have a breakover voltage value below ¾ V but above ½ V.

When other values of N are employed, the potential at point 14 will always be lowest when only one input terminal is raised to the input potential. The breakover voltage value of the Zener diode is selected to be above this value, but below the potential produced at point 14 when two or more input terminals are raised in potential in order to provide a "one out of N" circuit. The lowest value of potential at point 14 for different values of N will depend on the total parallel resistance value of the N—1 resistances. Thus, when N is six, the Zener diode is selected to have a breakover voltage value above ⅙ V but below ⅓ V for a "one out of six" circuit.

There are many separate applications for the present invention and, consequently, there are many distinct means for raising each of the circuit input terminals from ground potential (or other suitable lower potential) to a higher potential. Since such distinct means do not form a portion of the present invention, a symbolic representation has been provided in the form of a switch 12 connected to each terminal to raise the terminals from ground potential to a potential V. Also, the Zener diode 22 and the transistor 20 are particular examples of a threshold device and a switching device and other devices may be employed in the invention. The transistor 20 was shown in the drawing as an NPN type. A PNP type transistor may be employed by reversing the polarities of the voltages and reversing the direction of the Zener diode 16.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A circuit for providing an output signal responsive to up to M of N input signals comprising:

a source of at least one of N input signals where N is an integer greater than one, threshold means having first and second electrodes and being electrically conductive above a given threshold value and non-conductive below a given threshold value, resistance means connected between said input signal source and said first electrode of said threshold means for producing a signal condition at said first electrode representative of the number of said input signals from said source, said threshold means being responsive to said signal condition at said first electrode for conducting when more than M of said N input signals are represented, output means connected to said first electrode of said threshold means for providing an output signal in response to said signal condition at said first electrode, and switching means connected to said second electrode of said threshold means and to said output means for switching said output signal from said output means in response to said conduction of said threshold means when more than M of said N input signals are present.

2. The circuit of claim 1 wherein M is one.

3. The circuit of claim 1 wherein said source of input signal includes N separate terminals, each terminal adapted to selectively provide an input signal, and wherein said resistance means includes N separate resistors, each having first and second electrodes, said first electrode of each resistor connected to a separate one of said input terminals, and said second electrode of all said resistors being connected in common to said first electrode of said threshold means.

4. The circuit of claim 2 wherein said threshold means is a Zener diode.

5. The circuit of claim 3 wherein said switching means is a transistor having base, collector and emitter electrodes, said base electrode being connected to said second electrode of said Zener diode and said collector electrode being connected to said output means, said transistor conducting in response to conduction of said Zener diode for switching said output signal from said output means to said collector electrode.

6. The circuit of claim 4 wherein said output means is an electrical conductor connected to said first electrode of said Zener diode and to said collector of said transistor.

7. A circuit for providing an output signal responsive to any single one of N input signals comprising:

N input terminals, each adapted to be selectively raised to a given electric potential where N is an integer greater than one, a threshold means having first and second electrodes, said threshold means having a threshold level such that said threshold means is conductive above a given value of applied potential and nonconductive below said given value of applied potential, N resistance means, each having first and second electrodes, said first electrode of each resistance means being connected to a separate one of said input terminals and said second electrode of all said resistance means being connected in common to said first electrode of said threshold means for providing a potential on said first electrode of said threshold means representative of the number of said input terminals which are raised to said given electric potential, wherein said potential provided in said first electrode of said threshold means when only one of said input terminals is raised to said given electric potential is below the threshold level of said threshold means and said potential is above said threshold level when more than one of said input terminals are raised to said given electric potential, output means connected to said first electrode of said threshold means for providing an output signal in response to said potential provided on said first electrode, and switching means connected to said output means and said second electrode of said threshold means for switching said output signal from said output means in response to conduction by said threshold means when more than one of said input terminals are raised to said given electric potential.

8. The circuit of claim 7 wherein said threshold means is a Zener diode.

9. The circuit of claim 8 wherein said switching means is a transistor having base, collector and emitter electrodes, said base electrode being connected to the second electrode of said Zener diode, said collector electrode being connected to said output means and said emitter electrode at ground potential, said transistor conducting in response to conduction of said Zener diode for switching said output signal to ground potential.

10. The circuit of claim 9 wherein said output means is an electrical conductor connected to said first electrode of said Zener diode and to said collector of said transistor.

11. A circuit for performing the "EXCLUSIVE OR" logic function comprising:

first and second input terminals, each adapted to be separately raised from ground potential to a given potential V, a Zener diode having first and second electrodes and a breakover voltage value between ½ V and V, a pair of equal valued resistors, one of said resistors connected between said first terminal and said first electrode and the other of said resistors connected between said second terminal and said first electrode of said Zener diode for producing a potential ½ V on said first electrode when one of said input terminals is raised to potential V and a potential V on said first electrode when both of said input terminals is raised to potential V, said Zener diode conducting in response to potential V on said first electrode, an output conductor connected to said first electrode for providing an output signal in response to a potential on said first electrode, and a transistor connected between said output conductor and ground potential and further connected to said second electrode of said Zener diode, said transistor being responsive to conduction of said Zener diode for connecting said output means to ground potential and eliminating said output signal when a potential V is present on said first electrode of said Zener diode.

References Cited

UNITED STATES PATENTS

| | | | |
|---|---|---|---|
| 3,335,293 | 8/1967 | Horgan | 307—211 |
| 3,341,713 | 9/1967 | Shaffer et al. | 307—318 X |

DONALD D. FORRER, Primary Examiner

B. P. DAVIS, Assistant Examiner

U.S. Cl. X.R.

307—216, 318